US009543894B2

United States Patent
Akerman (10) Patent No.: US 9,543,894 B2
(45) Date of Patent: Jan. 10, 2017

(54) SPIN OSCILLATOR DEVICE

(71) Applicant: Johan Akerman, Sollentuna (SE)

(72) Inventor: Johan Akerman, Sollentuna (SE)

(*) Notice: Subject to any disclaimer, the term of this patent is extended or adjusted under 35 U.S.C. 154(b) by 0 days.

(21) Appl. No.: 14/776,090

(22) PCT Filed: Mar. 14, 2014

(86) PCT No.: PCT/SE2014/050311
§ 371 (c)(1),
(2) Date: Sep. 14, 2015

(87) PCT Pub. No.: WO2014/142740
PCT Pub. Date: Sep. 18, 2014

(65) Prior Publication Data
US 2016/0036384 A1  Feb. 4, 2016

(30) Foreign Application Priority Data
Mar. 14, 2013  (SE) .................................... 1350310

(51) Int. Cl.
*H03B 15/00* (2006.01)
*H01L 43/08* (2006.01)
*H01F 10/32* (2006.01)

(52) U.S. Cl.
CPC .......... *H03B 15/006* (2013.01); *H01F 10/329* (2013.01); *H01F 10/3286* (2013.01); *H01L 43/08* (2013.01); *H01F 10/3281* (2013.01)

(58) Field of Classification Search
USPC ....................................................... 331/94.1
See application file for complete search history.

(56) References Cited

U.S. PATENT DOCUMENTS

2009/0201614 A1  8/2009  Kudo et al.
2012/0075752 A1  3/2012  Sato et al.

FOREIGN PATENT DOCUMENTS

WO  03/054886 A2  7/2003

OTHER PUBLICATIONS

N.N. Akhmediev et al.; "Three sources and three component parts of the concept of dissipative solitons.", Lect. Notes Phys. 751, 1 (2008).
J.C. Slonczewski, "Current-driven excitation of magnetic multilayers.", J. Magn. Magn. Mater. 159, L1 (1996).
J.C. Slonczewski, "Excitation of spin waves by an electric current.", J. Magn. Magn. Mater. 195, L261 (1999).
L. Berger, Emission of spin waves by a magnetic multilayer traversed by a current., Phys., Rev. B 54, 9353 (1996).
D. Ralph et al., "Spin transfer torques.", J. Magn. Magn. Mater. 320, 1990 (2008).

(Continued)

*Primary Examiner* — Joseph Chang
(74) *Attorney, Agent, or Firm* — Renner, Otto, Boisselle & Sklar, LLP (57) ABSTRACT

The present invention relates to using spin transfer torque underneath a nanocontact on a magnetic thin film with perpendicular magnetic anisotropy (PMA), provides generation of dissipative magnetic droplet solitons and report on their rich dynamical properties. Micromagnetic simulations identify a wide range of automodulation frequencies including droplet oscillatory motion, droplet "spinning", and droplet "breather" states. The droplet can be controlled using both current and magnetic fields, and is expected to have applications in spintronics, magnonics, and PMA-based domain-wall devices.

21 Claims, 13 Drawing Sheets

(56) References Cited

OTHER PUBLICATIONS

M.A. Hoefer et al., "Propagating two-dimensional magnetic droplets.", Physica D 241, 890 (2012).
B.A. Ivanov et al., "Bound-states of a large number of magnons in a ferromagnet with one-ion anisotropy.", Zh. Eksp. Tero. Fiz. 72, 2000 (1977).
A.M. Kosevich et al, "Magnetic solitons.", Phys. Rep. 194, 117 (1990).
S. Bonetti et al., "Experimental evidence of self-localized and propagating spin wave modes in obliquely magnetized current-driven nanocontact.", Phys. Rev. Lett. 105, 217204 (2010).
W.H. Rippard et al., "Spin-transfer dynamics in spin valves with out-of-plane magnetized CoNi free layers.", Phys. Rev. B 81, 014426 (2010).
S.M. Mohseni et al., "High frequency operation of a spin-torque oscillator at low field.", Phys. Status Solidi RRL 5, 432 (2011).
O. Boulle et al., "Current-induced domain wall motion in nanoscale ferromagnetic elements.", Mat. Sci. Eng. R 72, 159 (2011).
V.V. Kruglyak et al. "Magnonics", J. Phys. D: Appl. Phys. 43, 264001 (2010).
International Search Report for corresponding patent application No. PCT/SE2014/050311 dated Mar. 14, 2014.
Mohseni Armaki, S.M.; "Spin valves and spin-torque oscillators with perpendicular magnetic anisotropy", Doctoral thesis, KTH Royal Institute of Technology, School of Information and Communication Technology (ICT), Material Physics, MF, Nov. 19, 2012, Trita-ICT/MAP AVH, ISSN 1653-7610; 2012:19, ISBN 978-91-7501-545-3; pp. 3, 10-11, 19, 31-33 and 35-48.
Hoefer, M.A. et al.; "Theory for a dissipative droplet soliton excited by a spin torque nanocontact" in: Physical Review B—Condensed Matter and Materials Physics, vol. 82, Issue 5, Aug. 30, 2010, Article No. 054432, ISSN 10980121; whole document.
Muduli, P.K. et al.; "Nonlinear frequency and amplitude modulation of a nanocontact-based spin-torque oscillator" in: Physical Review B—Condensed Matter and Materials Physics, vol. 81, Issue 14, Apr. 28, 2010, Article No. 140408, ISSN 10980121; whole document; figure 3.
Rippard, W.H. et al.; "Injection locking and phase control of spin transfer nano-oscillators" in: Physical Review Letters, vol. 95, Issue 6, Aug. 5, 2005, Article No. 067203, ISSN 00319007; whole document.
Hoefer, M.A. et al.; "Propagation and control of nanoscale magnetic-droplet solitons" in: Physical Review B—Condensed Matter and Materials Physics, vol. 85, Issue 21, Jun. 26, 2012, Article No. 214433, ISSN 10980121; whole document.
Liu, L. et al.; "Current-induced switching of perpendicularly magnetized magnetic layers using spin torque from the spin hall effect" in: Physical Review Letters, vol. 109, Issue 9, Aug. 29, 2012, Article No. 096602, ISSN 00319007; whole document.
Daughton, J.M. et al.; "Applications of spin dependent transport materials" in: Journal of Physics D: Applied Physics, vol. 32, Issue 22, Nov. 21, 1999, pp. R169-R177, ISSN 00223727; whole document.

SPIN OSCILLATOR DEVICE

This application is a national phase of International Application No. PCT/SE2014/050311 filed Mar. 14, 2014 and published in the English language.

FIELD OF THE INVENTION

The present invention relates to a spin oscillator device comprising a spin oscillator, and use of such a device.

BACKGROUND OF THE INVENTION

Spin oscillator devices, such as spin-torque oscillators (STO:s) that utilise spin angular momentum are known.

Dissipative solitons are localized excitations realized by a balance between nonlinearity, dispersion, gain, and loss. They can be experimentally observed in optical, chemical, granular, and liquid dissipative systems. Large amplitude nano-scale dynamics in magnetic thin films with perpendicular magnetic anisotropy (PMA) inherently possess all mechanisms supporting dissipative solitons except for gain.

Dissipative solitons have been reported in a wide range of nonlinear systems, but the observation of their magnetic analogue has been experimentally challenging. However, using STT as a gain mechanism in nanocontact (NC) based STOs, a magnetic dissipative soliton, a so-called "magnetic droplet", was recently proposed theoretically, but not realised. In particular, no strong enough, useful signal could be provided.

Dissipative solitons are often robust attractors and can exhibit exotic dynamics, such as time-periodic breathing making realization and practical use impossible.

Thus, there is still need to solve this, which has not been possible until now.

SUMMARY OF THE INVENTION

An object of the present invention is to provide a spin oscillator device having a controllable dissipative soliton.

According to an embodiment of the present invention, there is provided a spin oscillator device comprising a spin oscillator having a magnetic film with perpendicular magnetic anisotropy. The spin oscillator device comprises means, or is per se, configured to generate magnetic droplet solitons, wherein the means is configured to control the droplets solitons by means of applying current and/or magnetic fields.

An advantage with the present invention compared to what has until now been disclosed is that a strong enough, useful signal could be provided by means of the inventive device. Another advantage is high useful output power and that intrinsic dynamics such as automodulation can be suppressed making realization and practical use possible.

BRIEF DESCRIPTION OF THE DRAWING

The features and advantages of the present invention will become further apparent from the following detailed description and the accompanying drawing, of which:

FIG. 1'A shows a spin oscillator device according to an embodiment of the invention in a view from the side;

FIG. 1'B shows a spin oscillator device according to another embodiment of the invention in a view from the side;

FIG. 1'C shows an alternative embodiment;

FIGS. 1'D-F show alternative embodiments.

FIG. 1A shows frequency, integrated power (P), and magneto resistance (MR) as a function of perpendicular field at $I_{dc}=-6$ mA (and also $-1$ mA for the MR data) for a 63 nm NC-STO;

FIG. 1B shows current sweep of the same device as in FIG. 1a at $\mu_0H=0.8$ T;

FIG. 1C shows NC-STO on Co/Cu/Co—[Ni/Co]$_{x4}$ orthogonal spin-valve with a cross section of a reversed magnetic droplet shown on top;

FIG. 1D shows nucleation current, $I_{droplet}$, determined from MR measurements for three different NC diameters: 63, 88, and 110 nm;

DETAILED DESCRIPTION OF THE INVENTION

Embodiments of the present invention will be described as follows, starting with a detailed explanation of solitons and some basic principles related thereto. Specific references to a list of references are indicated within brackets.

Figure 1:
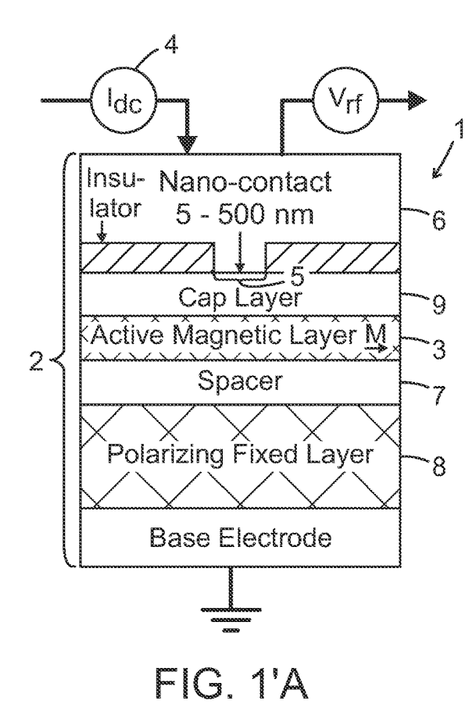
Figure 1A:
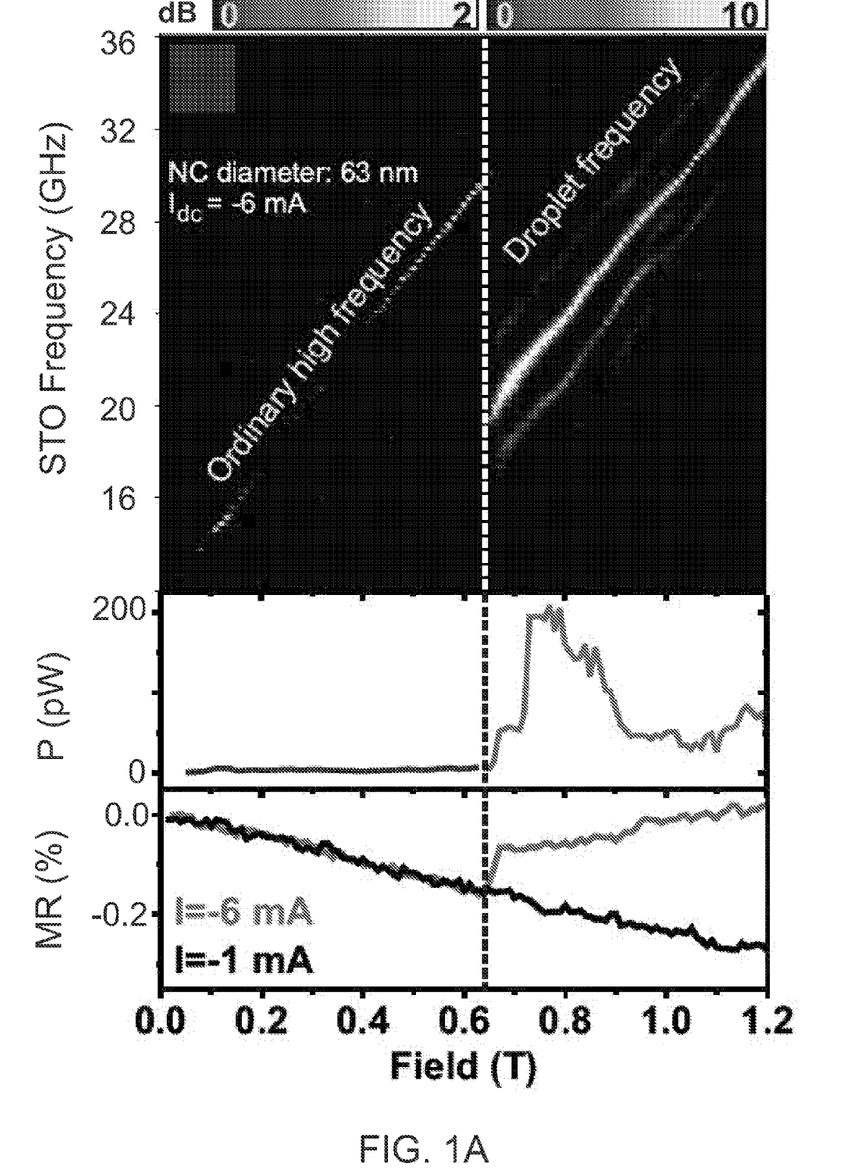

FIG. 1'A shows a spin oscillator device according to an embodiment of the invention.

The spin oscillator device 1 comprises a spin oscillator 2 having a magnetic layer 3 with perpendicular magnetic anisotropy. The spin oscillator device 1, and/or means 4, is configured to generate magnetic droplet solitons 5. The spin oscillator 2 is configured to control the droplets solitons 5 by means of injecting current $I_{dc}$, and/or applying magnetic fields. In this embodiment, the spin oscillator 2 is a spin torque oscillator, STO, wherein a nano-contact, NC, 6 is provided on the magnetic film 3 providing a so-called "NC-STO" 2, 6. The means 4 can be configured to apply spin transfer torque, STT, underneath the NC 6.

The spin oscillator 2 has an active magnetic layer 3 with magnetic properties such as to be susceptible to the generation of magnetic droplet solitons 5. One such property for magnetic droplet solitons generation is a perpendicular magnetic anisotropy that is large enough to orient the magnetization of the active magnetic layer 3 in an equilibrium direction M perpendicular to a plane of layer 3. Alternatively the active magnetic layer 3 may have a tilted anisotropy, or a combination of anisotropies, so as to provide a sufficient out-of-plane equilibrium orientation of the active magnetic layer 3. The generation of a magnetic droplet soliton 5 also requires means to overcome spin wave damping in the active area of the active magnetic layer 3. Such means include STT or spin pumping using the spin Hall effect.

Typically, in operation, spin polarized current $I_{dc}$ is injected through the NC 6 and excites oscillations of magnetization of a free layer 9, herein a cap layer, directly under the NC 6. These oscillations generate spin waves in the free layer 8 that propagate away from the NC 6. In this device, current flows perpendicular to a stack of layers 9, 3, 7, 8, wherein a polarizing fixed layer 8 serves as a current spin polarizer.

The spin oscillator 2 generates an output signal $V_{rf}$ through a magnetoresistive effect (spacer layer 7 is metal) such as giant magnetoresistance, tunneling magnetoresistance (spacer layer 7 is a tunneling barrier), or anisotropic magnetoresistance, or a combination thereof. The spin oscillator 2 may also generate an output signal $V_{rf}$ through magnetoresistive effects in other adjacent materials where the time-varying field from the magnetic droplet soliton 5 modulates the resistance or other property of the adjacent material.

Figure 1B:
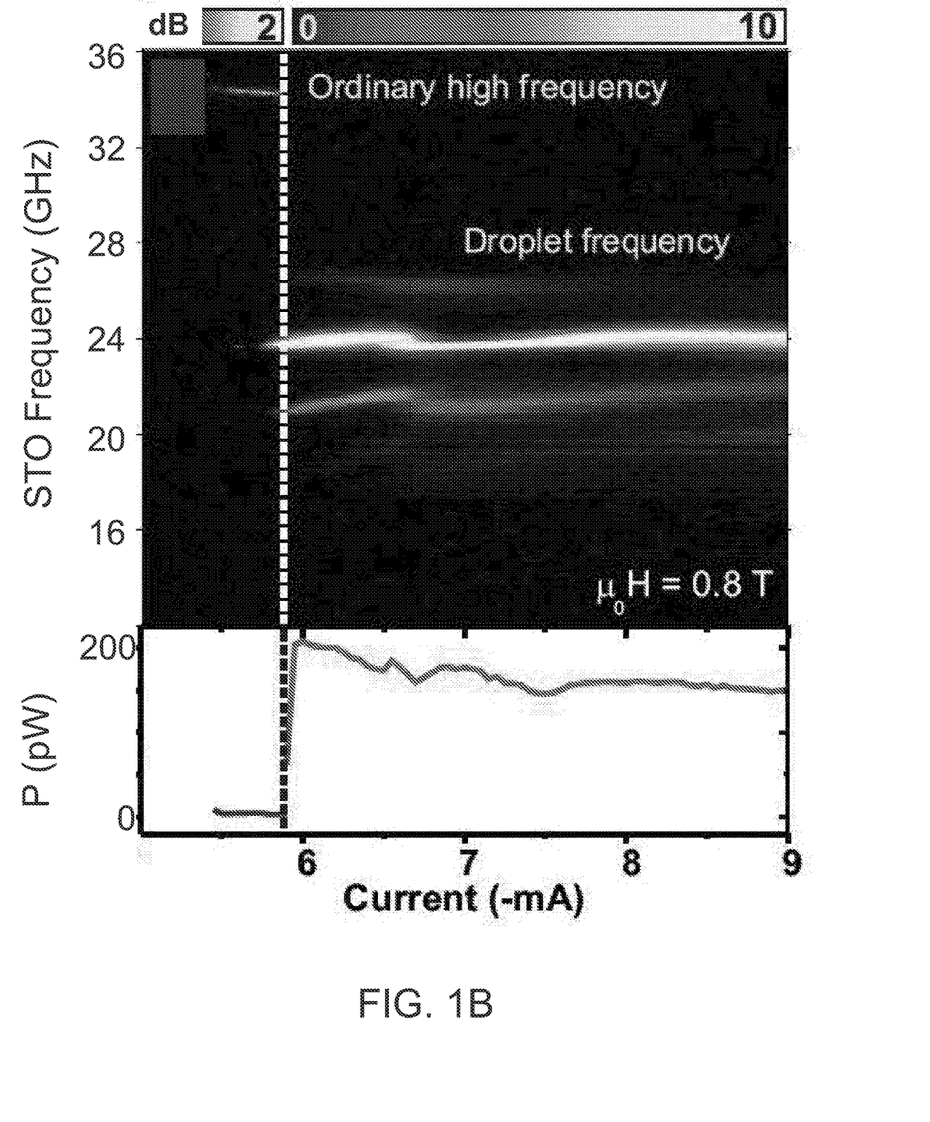

FIG. 1'B shows an alternative embodiment, wherein the cap layer 9 and the magnetic layer 3 are smaller than surrounding layers.

Figure 1C:
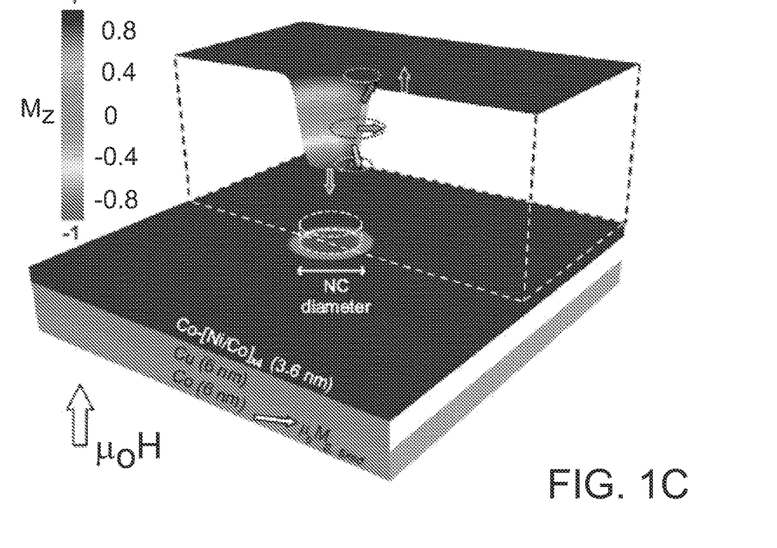

FIG. 1'C shows an alternative embodiment.

According to an alternative embodiment of the invention, the spin oscillator 2 is based on a spin Hall Effect, instead of STT. However, this embodiment will not be further explained in this context.

According to an embodiment of the invention, the NC-STO 2, 6 is based on orthogonal pseudospin valve stacks; according to another on perpendicular pseudospin valve stacks, and according to yet another on tilted pseudospin valve stacks. The tilted pseudospin valve stacks can be made of layers having different crystalline characteristics.

Alternatively, the NC-STO 2, 6 can be based on a magnetic tunnel junction, MTJ, wherein the tilted pseudospin valve stacks are made by two or more layers tilted at different angles.

Any of the magnetic properties have a spatial variation in any lateral direction.

A microwave current, or microwave field, or a combination of microwave current and field, at nominally the same frequency as the spin oscillator device can also be provided so as to improve the intrinsic microwave signal of the spin oscillator device.

Alternatively, a microwave current, or microwave field, or a combination of microwave current and field, at nominally any higher harmonic, or fractional harmonic, or lower sub-harmonic of the frequency of the spin oscillator device is provided so as to improve the intrinsic microwave signal of the spin oscillator device.

The provided microwave current and/or field can be originally generated by the spin oscillator device so as to provide feedback of the spin oscillator device onto itself.

A magnetic field or a current can modulate the operating point of the spin oscillator device.

The modulating magnetic field or current can modulate the operating point across the nucleation point of the magnetic droplet soliton.

The spin oscillator device can be employed for frequency shift keying.

Typical areas of use of a device disclosed above can be in one or more of: spintronics, magnonics, hard disk drives (reading head) or domain-wall devices.

Now is referred to FIGS. 1A-D, explaining the operation of an NC-STO in more detail for a better understanding of the embodiments given above, except for the spin oscillator based on the spin Hall effect, which will not be further explained in this context.

FIG. 1A shows frequency, integrated power P, and magneto resistance MR as a function of perpendicular magnetic field at $I_{dc}=-6$ mA (and also $-1$ mA for the MR data) for a 63 nm NC-STO. Below a magnetic field of 0.65 T (tesla), the FMR-like signal increases linearly as 28.7 GHz/T while MR decreases with $-0.25\%/T$. At $\mu_0 H_{droplet}=0.65$ T, the frequency drops by 10.3 GHz, modulation sidebands appear, and P jumps from 5 pW to 200 pW in two steps. MR experiences a jump at the same field followed by an increasing trend of $+0.17\%/T$.

FIG. 1B shows current sweep of the same device at $\mu_0 H=0.8$ T. At $I_{droplet}-5.8$ mA, the frequency again drops by 10 GHz, modulation sidebands appear, and P jumps from 5 pW to 200 pW. The modulation frequency shows a stronger current dependence and a faint second-order lower band becomes visible at about $-8$ mA.

Figure 1D:
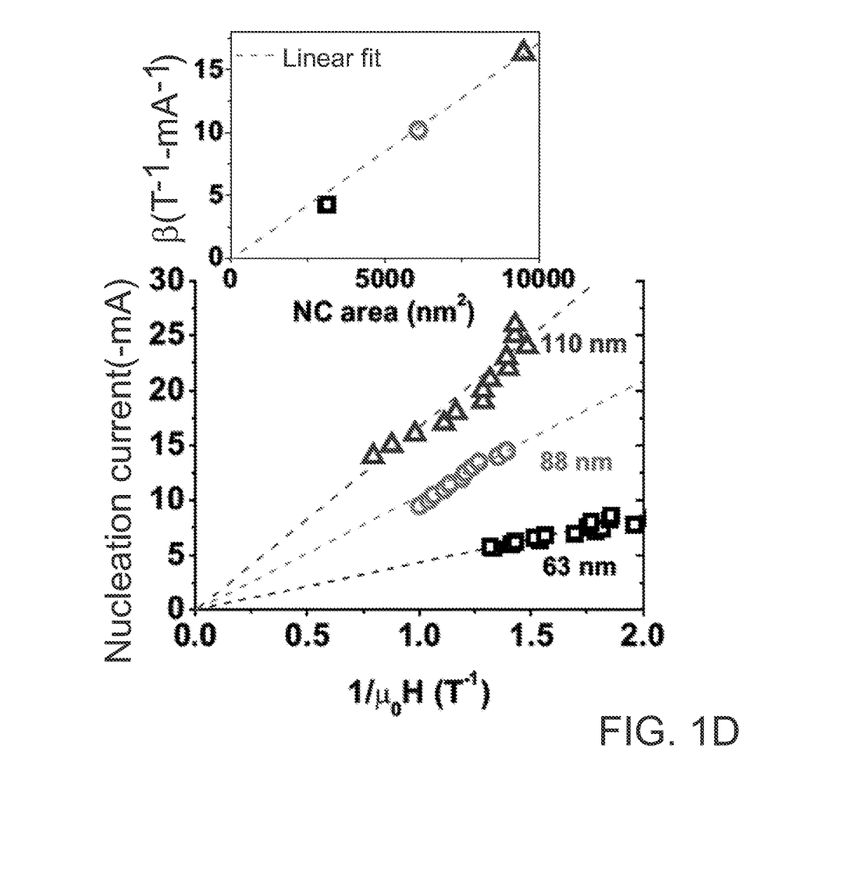

FIG. 1C shows NC-STO on Co/Cu/Co—[Ni/Co]$_{x4}$ orthogonal spin-valve with a cross section of a reversed magnetic droplet shown on top. Arrows surrounded by dotted circles indicate precession mechanism of droplet perimeter. FIG. 1D shows Nucleation current, $I_{droplet}$, determined from MR measurements for three different NC diameters: 63, 88, and 110 nm. Dashed lines: fit for $I_{droplet}=\beta (d_{NC})*(1/H)$. Inset: $\beta(d_{NC})$ vs. NC area together with a linear fit.

Classical conservative solitons, such as light pulses in a virtually lossless optical fiber, preserve their shape by balancing the opposing effects of dispersion (spreading) and nonlinearity (focusing). Similarly, if damping is ignored, the Landau-Lifshitz equation for an extended two-dimensional magnetic thin film with PMA can sustain a family of conservative magnetic solitons, known as "magnon drops" (16, 17). All spins in a magnon drop precess in phase around the film normal, with a precession angle $0<\Theta(0)<\pi$ at the center of the drop, and $0<\Theta(r)<\Theta(0)$ decreasing exponentially fast with radius to 0 in the far field. The family of stationary magnon drops can be parameterized by the precessional frequency $f_0$, satisfying $f_{Zeeman}<f_0<f_{FMR}$; where $f_{FMR}$ is the ferromagnetic resonance FMR frequency and $f_{Zeeman}$ is the Zeeman frequency. Magnon drops can be strongly nonlinear, exhibiting almost fully reversed cores $(\Theta(0) \to \pi)$ for $f_0$ close to $f_{Zeeman}$. Whereas conservative magnon drops balance exchange (dispersion) with anisotropy (nonlinearity) for each $f_0$, the dissipative magnetic droplet must also balance energy gain (STT) with dissipation (damping), singling out a particular droplet precession frequency for a given drive current and applied field (See FIG. 1C). More generally, dissipative soliton systems, such as the NC-STOs studied here, are natural environments for studying pattern formation. Dissipative solitons are often robust attractors and can exhibit exotic dynamics, such as time-periodic breathing (1). It has been claimed, but not until now realized, or proven, that NC-STOs with in-plane anisotropy and applied field exhibit nonlinear localization in the form of a weakly nonlinear spin wave bullet with precession angles much less than 90 degrees (18, 19). In contrast, the fully nonlinear dissipative droplet studied here necessarily involves precession angles greater than 90 degrees (13) thereby exhibiting a clear experimental signature and rich nonlinear behavior.

To test the theoretical predictions for a magnetic droplet (13), NC-STOs based on orthogonal pseudo spin valve stacks (FIG. 1C) were fabricated, where the magnetization of the Co fixed layer lies in the plane for zero applied field, whereas that of the Co/Ni multilayer free layer lies along the film normal as PMA is sufficiently strong to overcome the demagnetization field.

Figure 4:
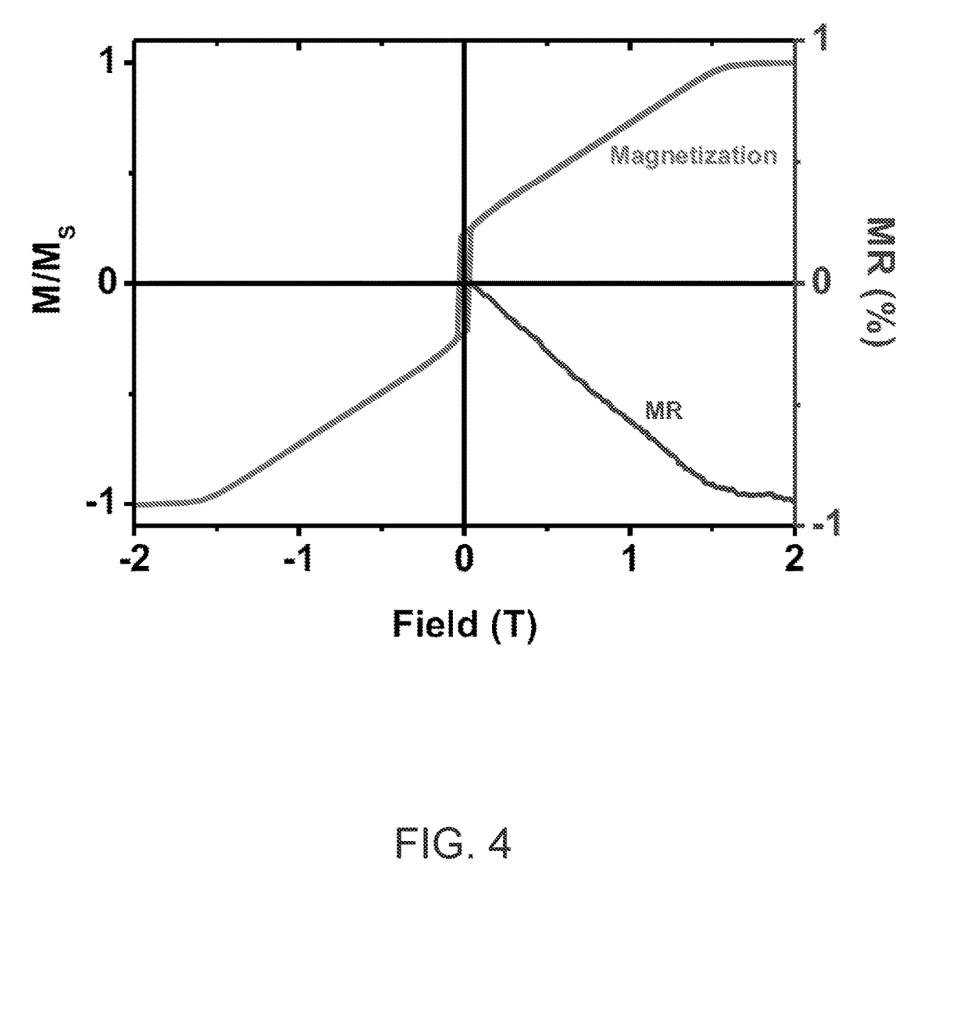
FIG. 4 shows perpendicular magnetization loop of the orthogonal pseudo spin valve measured up to ±2 T.

The field dependence of the microwave signal from a NC-STO with 63 nm NC diameter in low to moderate perpendicular fields (FIG. 1A) shows the expected linear FMR-like field dependence. However, at a critical magnetic field of about $\mu_0 H_{droplet}=0.65$ T, the precession frequency exhibits a dramatic drop to a frequency that lies between the Zeeman and FMR frequencies, with a simultaneous jump in the integrated power P. A similarly dramatic transition can be observed (FIG. 1B) as a function of current in a constant field of 0.8 T with similar changes in frequency and power. To gain further insight into the magnetic state as a function of field and current, the magneto resistance (MR=[R(H)−R(H=0)]/R(H=0); R=device resistance) was measured both at −6 mA and at a lower current of −1 mA (FIG. 1A inset). Below 0.65 T, the MR exhibits an identical linear decrease for both currents, consistent with a linearly increasing out-of-plane component of the fixed layer magnetization and an increasingly parallel state of the NC-STO. At exactly $\mu_0 H_{droplet}$=0.65 T, MR(I=−6 mA) exhibits a jump of 0.1%, and its field dependence changes sign; the NC-STO state is thus now becoming increasingly antiparallel with increasing field. Contrarily, MR(I=−1 mA) does not show any sign of transition and continues to decrease linearly, eventually saturating in a field of 1.6-1.8 T [see FIG. 4], consistent with the expected saturation field for the Co layer.

Both the dynamic and static observations are consistent with the formation of a magnetic droplet in the free layer. The large drop in frequency and the sign change of the field-dependent resistance further indicate a substantially reversed central region. This is corroborated by the large increase in microwave power, because a reversed droplet will have a large area of spins precessing around the equator, whereas the precession angle of the FMR-like mode is very limited close to the threshold for STO dynamics. Finally, according to the theory of the magnetic droplet, its frequency ($f_{droplet}$) should increase linearly with field at a slope of $\gamma/2\pi$ ($\gamma$ is the gyromagnetic ratio so $\gamma/2\pi$=28.7 GHz/T) and decrease very weakly with current, in agreement with FIGS. 1A and 1B, respectively.

From the MR value at the transition, it can be concluded that the Co layer tilt angle required to nucleate a droplet at −6 mA is about 50 degrees. Assuming that the nucleation is primarily driven by the perpendicular component of the spin-polarized current density, we expect the required nucleation current to be inversely proportional to the perpendicular component $M_z$ of the fixed layer magnetization. Because $M_z$ is linearly proportional to the perpendicular field for the easy-plane Co [FIG. 4], we can directly test this assumption by plotting the nucleation current ($I_{droplet}$) vs. inverse applied field, 1/H (FIG. 1D). We indeed observed that $I_{droplet}$ is inversely proportional to the applied field, and that the slope of this dependence scales with NC area, confirming that the droplet nucleation is governed by the perpendicular component of the spin-polarized current density, regardless of the applied field and NC size.

Figure 2A:
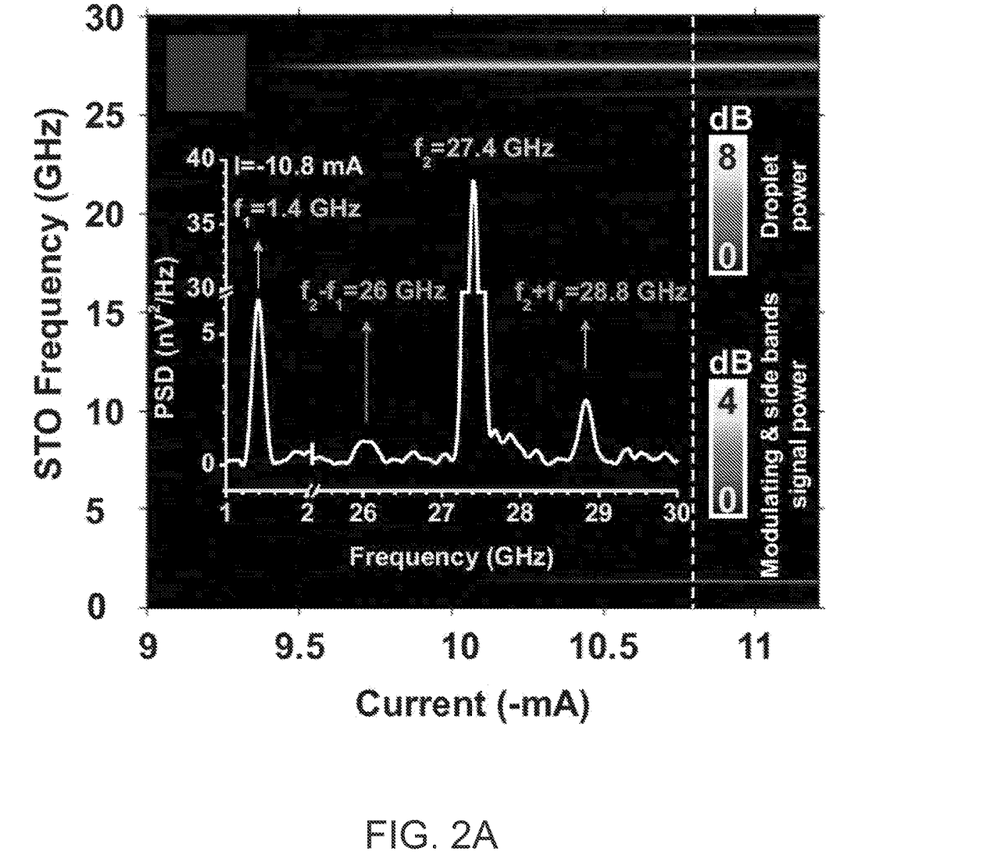
FIG. 2A shows droplet auto modulation in an 88 nm NC-STO (perpendicular field of 0.9 T.
Figure 2B:
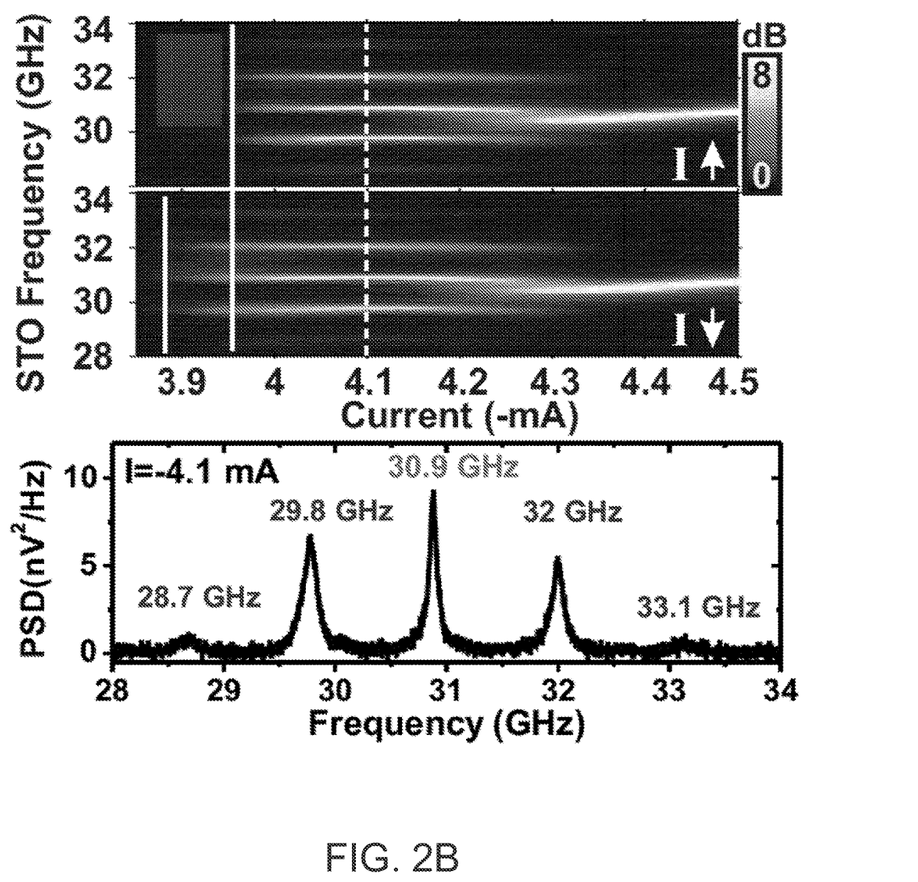
FIG. 2B shows auto-modulation in a 60 nm NC-STO (perpendicular field of 0.9 T) leading to both first and second-order sidebands (PSD at −4.1 mA shown in the inset below)
Figure 2C:
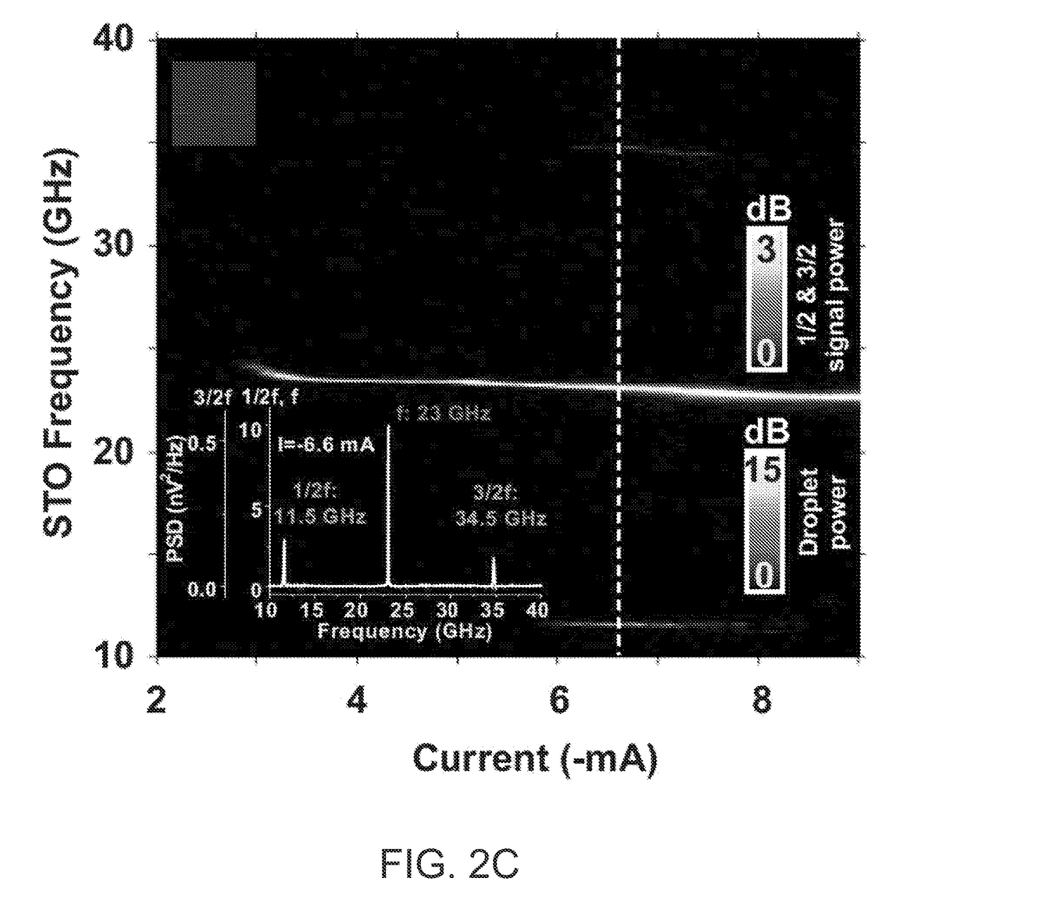
FIG. 2C shows observation of sidebands at $f_{droplet}/2$ and $3f_{droplet}/2$ (63 nm NC-STO, 0.8 T field applied at 30 degrees w.r.t. the plane)

Now is referred to FIGS. 2A-C.

FIG. 2A shows droplet auto modulation in an 88 nm NC-STO (perpendicular magnetic field of 0.9 T). Inset shows: Power spectral density (PSD) at −10.8 mA showing both the modulating signal at 1.4 GHz and the resulting modulation sidebands. FIG. 2 B shows auto modulation in a 60 nm NC-STO (perpendicular field of 0.9 T) leading to both first and second-order sidebands (PSD at −4.1 mA shown in the inset below). The onset current (solid white lines) exhibit a hysteresis of about 0.1 mA. FIG. 2C shows observation of sidebands at $f_{droplet}/2$ and $3f_{droplet}/2$ (63 nm NC-STO, 0.8 T field applied at 30 degrees w.r.t. the plane), consistent with droplet breathing (inset: PSD at −6.4 mA). Note the different scale for the much weaker sideband signals.

Now turn to the modulation sidebands that appear simultaneously with the nucleation of the magnetic droplet. The droplet and its field dependence are very robust and reproducible from device to device, however greater variation in the modulation was found, with some devices showing single (FIG. 2A) and multiple (FIG. 2B) well-defined sideband pairs, some showing strong peaks at $f_{droplet}/2$ (with some power at $3f_{droplet}/2$) (FIG. 2C), and others not showing any modulation at any current or field. In some cases, pure single-tone operation may be preceded by modulated behavior at lower currents (FIG. 2B); the onset current is dependent on the direction of the current sweep. The low-frequency (~1 GHz) modulating signal can be measured directly (FIG. 2A). Because all our measurements involved DC drive alone, the observed modulation is unrelated to ordinary STO modulation, in which the drive current contains an intentionally superimposed modulating current. The observed automodulation must instead be intrinsic to the droplet.

Now is referred to FIGS. 3A-D, which show time sequences of out-of-plane, $m_z$, and in-plane (vector field) magnetization component of free layer from micro-magnetic simulation. On the right is the power spectrum associated with the NC-averaged projection of magnetization onto the polarization layer. Parameters are given as triples (field, NC diameter, current).

Figure 3:
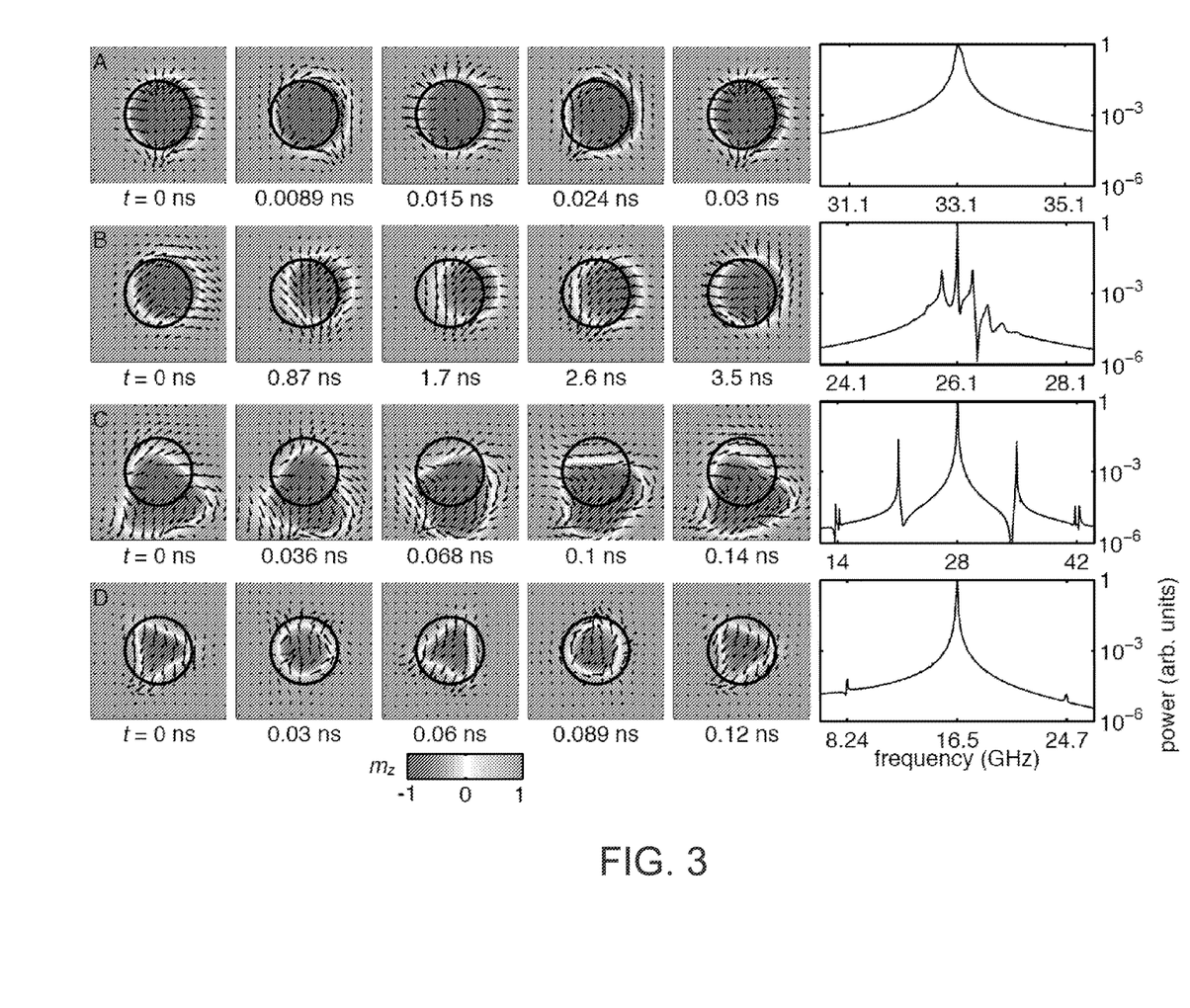
FIGS. 3A-D show time sequences of out-of-plane, $m_z$ (in color), and in-plane (vector field) magnetization component of free layer from micro-magnetic simulation.

FIG. 3A shows stationary droplet precession with a single spectral peak for large field (1.1 T, 80 nm, −12 mA). FIG. 3B shows droplet oscillation leading to prominent sidebands for moderate field (0.8 T, 63 nm, −8 mA). FIG. 3C shows spinning of an asymmetric droplet for moderate field (0.9 T, 50 nm, −9 mA). FIG. 3D shows droplet perimeter deformations (breathing) with period twice the precessional period (0.5 T, 80 nm, −8 mA).

With the aid of dissipative droplet theory and micro-magnetic simulations, these complex dynamics can be identified with novel dynamical wave states, including quasi-periodic and periodic structures. At nucleation, the dramatic drop in frequency is associated with droplet formation, where all the spins in the droplet precess uniformly at a single fixed frequency (FIG. 3A). In (13), a droplet drift instability was identified whereby the droplet was ejected from the NC area, eventually succumbing to damping, leaving room for the nucleation of a new droplet in a periodic fashion. This process occurs on a nanosecond timescale, consistent with the experimentally observed modulation sidebands. However, this explanation is not consistent with the observed hysteresis (FIG. 2B), predicted for stable, non-drifting droplets (13) because it precludes the periodic death and rebirth of the droplet. Upon decrease of the current below the nucleation threshold, a new droplet cannot form once the first droplet has disappeared. Micro-magnetic simulations reveal two possible explanations for this discrepancy relying on the presence of a sufficiently canted polarizer for moderate fields. The drifting droplet may experience a restoring force leading to gyrotropic-like motion of the droplet within the NC area with a characteristic ~1 GHz frequency (FIG. 3B); depending on other parameters, micro-magnetic simulations also reveal asymmetric droplets that "spin" on the edge of the NC area while emitting spin waves (FIG. 3C), exhibiting sidebands with frequency spacings of several GHz. For strong canting of the polarizer away from the film normal (weak fields), periodic dynamics were observed with signals at 1/2 and 3/2 of the fundamental frequency (FIG. 3D). These characteristic signals was identified with a breathing mode, whose observed breathing frequency is half the precessional frequency (FIG. 2C). Generally, micro-magnetic simulations at larger fields tend to exhibit stable precessional dynamics, whereas lower fields can lead to unstable behavior or modulation sidebands by way of droplet oscillations, breathing, and spinning.

Besides the fundamental interest of the creation and control of dissipative solitons in magnetic systems, including e.g. surface magnetic drops expected in thick PMA films, the impact is discussed that the observed magnetic droplet may have on applications, in particular its influence on the emerging fields of STOs, domain-wall electronics, and magnonics. For STOs, the dramatic frequency drop enables ultra-broadband frequency-shift keying FSK, where the carrier frequency can be switched by about 10 GHz by varying the drive current a fraction of its absolute value, which is a very wide frequency shift in contrast to prior art. Micromagnetic simulations indicate nucleation on the sub-nanosecond timescale, but the definitive modulation rate should be determined experimentally. In the emerging field of domain-wall electronics with PMA materials, the magnetic droplet may be used as a current-controlled nanoscopic domain-wall injector, and hence facilitate the implementation of compact domain-wall devices. By applying local field gradients, the magnetic droplet can be transported away from the nanocontact region, carrying information on its own or spatially modifying local spin wave propagation in magnonic devices. These magnetic droplets hence may join domain walls and magnetic vortices as distinct and useful nanomagnetic objects.

This embodiment may be employed in field sensors.

Experimental Techniques

Orthogonal pseudo spin valve stacks Co6 nm/Cu6 nm/Co0.2 nm—[Ni0.6 nm/Co0.25 nm]$_4$ with Ta4 nm/Cu10 nm/Ta4 nm seed and Cu2 nm/Pd2 nm cap layers were sputter-deposited in ultrahigh vacuum on thermally oxidized Si wafers. The films were patterned to 8×16 µm$^2$ mesas using optical lithography, and then coated with 30 nm SiO$_2$ interlayer dielectric deposited by chemical vapor deposition. The NC was defined using electron beam-lithography and reactive ion etching through the SiO$_2$. Finally, a 1.1 µm Cu top electrode was fabricated by optical lithography, sputter deposition, and lift-off. The free layer in-plane saturation field of 0.35 T was determined using both magneto resistance (MR) and magnetization measurements.

The perpendicular magnetization loop of the orthogonal pseudo spin valve measured to ±2 T (See FIG. 4) shows the [Co/Ni] free layer switching at low external field (~0.04 T) followed by the linear response of the Co fixed layer and its saturation at large external field (~1.6 T). MR of a 85 nm NC device with I=−5 mA (well below its oscillation threshold) measured in a perpendicular field between 0 and 2 T confirming the same linear response of the Co fixed layer's magnetization as it decreases linearly from low field and saturates at about 1.6 T.

The foregoing detailed description is intended to illustrate and provide easier understanding of the invention, and should not be construed as limitations. Alternative embodiments will become apparent to those skilled in the art without departing from the spirit and scope of the present invention.

LIST OF REFERENCES

1. N. N. Akhmediev, A. Ankiewicz, Three sources and three component parts of the concept of dissipative solitons. *Lect. Notes Phys.* 751, 1 (2008).
9. J. C. Slonczewski, Current-driven excitation of magnetic multilayers. *J. Magn. Magn. Mater.* 159, L1 (1996).
10. J. C. Slonczewski, Excitation of spin waves by an electric current. *J. Magn. Magn. Mater.* 195, L261 (1999).
11. L. Berger, Emission of spin waves by a magnetic multilayer traversed by a current. *Phys. Rev. B* 54, 9353 (1996).
12. D. Ralph, M. Stiles, Spin transfer torques. *J. Magn. Magn. Mater.* 320, 1190 (2008).
13. M. A. Hoefer, T. J. Silva, M. W. Keller, Theory for a dissipative droplet soliton excited by a spin torque nanocontact. *Phys. Rev. B* 82, 054432 (2010).
14. M. A. Hoefer, M. Sommacal, Propagating two-dimensional magnetic droplets. *Physica D* 241, 890 (2012).
15. M. A. Hoefer, M. Sommacal, T. J. Silva, Propagation and control of nanoscale magnetic-droplet solitons. *Phys. Rev. B* 85, 214433 (2012).
16. B. A. Ivanov, A. M. Kosevich, Bound-states of a large number of magnons in a ferromagnet with one-ion anisotropy. *Zh. Eksp. Teor. Fiz.* 72, 2000 (1977).
17. A. M. Kosevich, B. A. Ivanov, A. S. Kovalev, Magnetic solitons. *Phys. Rep.* 194, 117 (1990).
19. S. Bonetti et al., Experimental evidence of self-localized and propagating spin wave modes in obliquely magnetized current-driven nanocontacts. *Phys. Rev. Lett.* 105, 217204 (2010).
20. W. H. Rippard et al. Spin-transfer dynamics in spin valves with out-of-plane magnetized CoNi free layers. *Phys. Rev. B* 81, 014426 (2010).
21. S. M. Mohseni et al. High frequency operation of a spin-torque oscillator at low field. *Phys. Status Solidi RRL* 5, 432 (2011).
24. P. K. Muduli et al. Nonlinear frequency and amplitude modulation of a nanocontact-based spin-torque oscillator. *Phys. Rev. B* 81, 140408(R) (2010).
26. M. Manfrini et al. Agility of vortex-based nanocontact spin torque oscillators. *Appl. Phys. Lett.* 95, 192507 (2009).
27. O. Boulle, G. Malinowski, M. Kläui, Current-induced domain wall motion in nanoscale ferromagnetic elements. *Mat. Sci. Eng. R* 72, 159 (2011).
28. V. V. Kruglyak, S. O. Demokritov, D. Grundler, Magnonics. *J. Phys. D: Appl. Phys.* 43, 264001 (2010).
30. M. Madami et al. Direct observation of a propagating spin wave induced by spin-transfer torque. *Nature Nanotech.* 6, 635 (2011).

The invention claimed is:

1. A spin oscillator device comprising a spin oscillator having a magnetic film with perpendicular magnetic anisotropy; and; wherein the spin oscillator device comprises means configured to generate magnetic droplet solitons, wherein the means is configured to control the droplets solitons by means of applying current and/or magnetic fields.

2. The spin oscillator device according to claim 1, wherein the spin oscillator is a spin torque oscillator, STO, wherein a nano-contact, NC, is provided on said magnetic film providing an NC-STO, and the means are configured to apply spin transfer torque underneath the NC.

3. The spin oscillator device according to claim 1, wherein the spin oscillator is based on a spin Hall Effect.

4. The spin oscillator device according to claim 2, wherein the means is configured to control the droplets solitons by means of applying current.

5. The spin oscillator device according to claim 2, wherein the means is configured to control the droplets solitons by means of magnetic fields.

6. The spin oscillator device according to claim 1, wherein the NC-STO is based on orthogonal pseudospin valve stacks.

7. The spin oscillator device according to claim 2, wherein the NC-STO is based on perpendicular pseudospin valve stacks.

8. The spin oscillator device according to claim 2, wherein the NC-STO is based on tilted pseudospin valve stacks.

9. The spin oscillator device according to claim 2, wherein the NC-STO is based on tilted pseudospin valve stacks where the tilt angle is non-uniform.

10. The spin oscillator device according to claim 2, wherein the NC-STO is based on a magnetic tunnel junction, MTJ.

11. The spin oscillator device according to claim 2, wherein the NC-STO is based on a combination of pseudospin valves and magnetic tunnel junctions, MTJ.

12. The spin oscillator device according to claim 8, wherein the tilted pseudospin valve stacks are made by layers having different crystalline characteristics.

13. The spin oscillator device according to claim 8, wherein the tilted pseudospin valve stacks are made by two or more layers tilted at different angles.

14. The spin oscillator device according to claim 1, wherein any of the magnetic properties have a spatial variation in any lateral direction.

15. The spin oscillator device according to claim 1, wherein a microwave current, or microwave field, or a combination of microwave current and field, at nominally the same frequency as the spin oscillator device is provided so as to improve the intrinsic microwave signal of the spin oscillator device.

16. The spin oscillator device according to claim 1, wherein a microwave current, or microwave field, or a combination of microwave current and field, at nominally any higher harmonic, or fractional harmonic, or lower sub-harmonic of the frequency of the spin oscillator device is provided so as to improve the intrinsic microwave signal of the spin oscillator device.

17. The spin oscillator device according to claim 15, wherein the provided microwave current and/or field is originally generated by the spin oscillator device so as to provide feedback of the spin oscillator device onto itself.

18. The spin oscillator device according to claim 1, wherein a magnetic field or a current modulates the operating point of the spin oscillator device.

19. The spin oscillator device according to claim 18, wherein the modulating magnetic field or current modulates the operating point across the nucleation point of the magnetic droplet soliton.

20. The spin oscillator device according to claim 1, where the spin oscillator device is employed for frequency shift keying.

21. Use of a device according to claim 1 in one or more of: spintronics, magnonics, hard disk drives (reading head) or domain-wall devices.

* * * * *